United States Patent
Ahn et al.

(10) Patent No.: US 6,930,951 B2
(45) Date of Patent: Aug. 16, 2005

(54) SEMICONDUCTOR MEMORY DEVICE CAPABLE OF ACCESSING DATA IN CONTINUOUS BURST MODE REGARDLESS OF LOCATION OF ACCESSED DATA

(75) Inventors: Jin-Hong Ahn, Ichon-shi (KR); Sang-Hoon Hong, Ichon-shi (KR); Jae-Bum Ko, Ichon-shi (KR); Se-Jun Kim, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/744,322

(22) Filed: Dec. 22, 2003

(65) Prior Publication Data

US 2004/0264278 A1 Dec. 30, 2004

(30) Foreign Application Priority Data

Jun. 30, 2003 (KR) .................... 10-2003-0043422

(51) Int. Cl.[7] ................................................ G11C 8/00
(52) U.S. Cl. ............................ 365/230.03; 365/230.06; 365/239
(58) Field of Search ................. 365/230.03, 230.06, 365/239

(56) References Cited

U.S. PATENT DOCUMENTS

| 5,729,504 A | 3/1998 | Cowles |
| 5,838,661 A | 11/1998 | Leger et al. |
| 5,946,265 A | 8/1999 | Cowles |
| 6,205,081 B1 | 3/2001 | Lee |
| 6,343,040 B2 | 1/2002 | Bae |
| 6,401,186 B1 | 6/2002 | Blodgett |
| 6,545,932 B1 * | 4/2003 | Sunaga et al. ......... 365/230.03 |
| 2001/0021136 A1 | 9/2001 | Bae |
| 2002/0110037 A1 * | 8/2002 | Fukuyama .............. 365/230.03 |
| 2003/0070051 A1 | 4/2003 | Soerensen et al. |

FOREIGN PATENT DOCUMENTS

| JP | 6-97928 | 4/1994 |
| JP | 10-124447 | 5/1998 |

* cited by examiner

*Primary Examiner*—Huan Hoang
(74) *Attorney, Agent, or Firm*—Blakely Sokoloff Taylor & Zafman

(57) ABSTRACT

There is provided a semiconductor memory device and a method for driving the same, which is capable of accessing data in a continuous burst mode regardless of locations of accessed data. The semiconductor memory device includes: a first bank including a first word line corresponding to a first row address; and a second bank including a second word line corresponding to a second row address, wherein the second row address is consecutive to the first row address. The method for driving a semiconductor memory device includes the steps of: receiving a first row address corresponding to a command; activating a word line of a first bank corresponding to the first row address; activating a word line of a second bank corresponding to a second row address, in which the second row address is consecutive to the first row address; sequentially accessing the predetermined number of data among the N data in a plurality of unit cells corresponding to the word line of the first bank; and sequentially accessing the remaining data in a plurality of unit cells corresponding to a word line of the second bank.

7 Claims, 6 Drawing Sheets

SEMICONDUCTOR MEMORY DEVICE CAPABLE OF ACCESSING DATA IN CONTINUOUS BURST MODE REGARDLESS OF LOCATION OF ACCESSED DATA

FIELD OF THE INVENTION

The present invention relates to a semiconductor memory device; and, more particularly, to a semiconductor memory device that is capable of accessing data in a continuous burst mode regardless of locations of accessed data.

DESCRIPTION OF THE PRIOR ART

A semiconductor memory device includes a plurality of banks in order to improve a system performance. A multi-memory bank structure makes it possible for each memory bank to independently access data and selects one of banks by decoding the most significant bit of a row address.

FIG. 1 is a block diagram showing input/output (I/O) pins of a conventional memory device.

Referring to FIG. 1, a conventional memory device includes a plurality of command input pins configured to receive command signals, n row address input pins RA0 to RAn−1 configured to receive n row addresses, m column address input pins CA0 to CAm−1 configured to receive m column addresses, and a plurality of data I/O pins DQ0 to DQ15 configured to input/output data selected by the row addresses and the column addresses.

In addition, a double data rate (DDR) synchronous memory device receives a data strobe signal and a complementary data strobe signal through data strobe signal input pins DQS and /DQS. The data strobe signal is a signal that is clocked during a data input timing. A synchronous memory device aligns the input data using the data strobe signal.

Here, the number of data input pins is determined according to the number of data that can be inputted/outputted at a time in the memory device, generally eight or sixteen.

Further, the number of the row address input pins RA0 to RAn−1 and the number of the column address input pins CA0 to CAm−1 are determined according to the number of unit cells provided in the memory device. If the number of unit cells provided in the memory device is 1 G, a total number of the unit cells are $2^{30}$, and the number of address pins are 30. If the memory device includes four banks, one bank of 1 G memory device is provided with 256 Mega ($2^{28}$) unit cells.

In this case, the number of row address input pins is 16 and the number of column address input pins is 14. The reason why the number of the row address input pins is larger than the number of the column address input pins is that the number of the row address input pins includes the bank address. For example, if the memory device includes four banks, the highest two addresses among the row addresses are used to select one bank.

FIG. 2 is a block diagram of a conventional memory device

Referring to FIG. 2, the memory device includes a bank selecting unit 60 for receiving n-th and (n−1)-th row addresses RAn−1 and RAn−2 and activating one of four bank select signals BS0 to BS3 in order to select one of four banks, and four banks 10 to 40 enabled in response to the four bank select signals BS0 to BS3.

The banks 10 to 40 include row decoders 11, 21, 31 and 41 for decoding row addresses to select one of word lines WL0 to WL$2^{n-3}$ provided in one bank, column decoders 12, 22, 32 and 42 for decoding column addresses to select one of $2^m$ bit line pairs provided in one bank, and bit line sense amplifiers 13, 23, 33 and 43 for sensing/amplifying output data of bank to output data applied to the bit line pair that are selected by the column decoders 12, 22, 32 and 42. In addition, each bank includes $2^{n-3}$ word lines and $2^m$ bit line pairs.

Further, the memory device includes a data output buffer 50 for amplifying and latching data outputted from the respective banks 10 to 40 and outputting the amplified and latched data.

Hereinafter, an operation of the conventional memory device will be described in detail with reference to FIGS. 1 and 2.

If the memory device operates, a command according to a read or write operation is inputted through the command input pin. The n-bit row addresses and the m-bit column addresses corresponding to the inputted command are inputted through the row address input pins RA0 to RAn−1 and the column address input pins CA0 to CAm−1, respectively.

Then, the row addresses inputted through the highest two input pins RAn−1 and RAn−2 among the n-bit row addresses are inputted to the bank selecting unit 60, and the bank selecting unit 60 decodes the inputted row addresses to activate one of the four bank select signals BS0 to BS3.

The row decoder 11 provided in the bank (e.g., the bank0 10) selected by the bank select signal (e.g., BS0) is enabled, and the row addresses inputted through the row address input pins RA0 to RAn−3 are inputted to the row decoder 11 of the bank0 10.

Then, the row decoder 11 decodes the inputted (n−2) row addresses to activate one of the $2^{n-2}$ word lines provided in the bank. The $2^m$ data stored in the unit cells corresponding to the activated word line (e.g., WL0) is sensed/amplified by the bit line sense amplifier 13 provided in one side of the bank0 10.

Then, the column decoder 12 decodes the column addresses to select one of the $2^m$ sense amplifiers provided in the bit line sense amplifier 13. The bit line sense amplifier 13 includes the sense amplifiers as many as the number of the bit line pairs provided in the bank0 10 and the sense amplifiers are connected to the respective bit line pairs.

If the executing command is a read command, the data signal sensed/amplified by the selected sense amplifier is outputted through the data output buffer 50, and if the executing command is a write command, the external data is latched by the selected sense amplifier.

Then, the $2^m$ data sensed/amplified by the bit line sense amplifier 13 are re-stored into the $2^m$ unit cells corresponding to the word line activated by the executing command.

FIG. 3 is a block diagram showing problems of the conventional memory device. Herein, the problems of the conventional memory device will be described with reference to FIG. 3.

The memory device employs a "burst mode" in order to access data faster. The burst mode is a mode that the bit line sense amplifier senses/amplifies the $2^m$ data corresponding to the word line activated by the inputted address and then data are sequentially inputted/outputted using the sensed/amplified data without any additional input of the addresses.

Since the additional addresses are not inputted after the data corresponding to the activated word line are sensed/amplified, a plurality of data can be inputted/outputted at a high speed.

Referring to FIG. 3, a word line (e.g., WL9) of the bank0 10 is activated in response to the inputted row addresses corresponding to the command, and data stored in the $2^m$ unit cells (cells 0 to $2^m-1$) on the activated word line (WL9) are sensed/amplified by the $2^m$ sense amplifiers provided in the bit line sense amplifier 13.

At this time, in case a burst length is "4" and the column addresses inputted by the executing command are decoded to select the sense amplifier SA0, the four data sensed/amplified by the sense amplifiers SA0 to SA3 are sequentially outputted to an exterior. Here, the "burst length" is the number of data that are sequentially outputted in the burst mode. If the burst length is "8", eight data sensed/amplified by the sense amplifiers SA0 to SA7 are sequentially outputted to an exterior.

However, in case the burst length is "4", if the sense amplifier SA$2^m-2$ is selected, only two data are sequentially outputted since only one data corresponding to the highest addresses is sensed/amplified.

In this case, two data sensed/amplified by the sense amplifiers SA$2^m-2$ and SA$2^m-1$ are once outputted sequentially and the $2^m$ data sensed/amplified by the bit sense amplifier 13 are then re-stored into the word line WL9. Thereafter, the next word line WL10 is activated. The $2^m$ data corresponding to the word line WL10 are again sensed/amplified and two data corresponding to the sense amplifiers SA0 and SA1 are outputted. Accordingly, the four data are not outputted sequentially, but two data are outputted after a predetermined time from the output of two data.

In case the burst length is "8", eight data are not outputted sequentially, but six data are outputted sequentially after a predetermined time from the output of two data.

Accordingly, even in the burst mode, there may occur the cases that all the data corresponding to the burst length are not outputted sequentially because of the location of data accessed corresponding to the inputted column addresses.

In order to solve the above problem, the conventional memory device employs a wrap mode. If it is checked from the current inputted column addresses that data corresponding to the burst length are all sensed/amplified, the wrap mode is turned off to sequentially output all the data corresponding to the burst length. If the number of the sensed/amplified data is smaller than the burst length, the wrap mode is turned on to regularly circulate the inputted column addresses and then output the data corresponding to the circulated column addresses.

For example, it is assumed that the column address is "2". In case the wrap mode is in a turned-off state, data corresponding to the column addresses 2, 3, 4 and 5 are sequentially outputted. In case the wrap mode is in a turned-on state, data corresponding to the column addresses 2, 3, 0 and 1 are sequentially outputted. The turned-off state of the wrap mode is referred to as a "continuous burst mode".

The number of data sensed/amplified at a time in the memory device is referred to as a "page". The page is determined by the number of the sense amplifiers provided in the bit line sense amplifier.

The conventional memory device can operate in the continuous burst mode since it outputs consecutive data at a high speed within one page. However, since the conventional memory device cannot output consecutive data at a boundary portion between pages, it operates in the turned-off state of the wrap mode.

In other words, according to the locations of accessed data, the conventional memory device can or cannot continuously input/output the plurality of data at a high speed. As a result, there is a limit to the performance of an overall system since an external device, such as a chipset, that transmits/receives to/from the memory device cannot always receive a plurality of data at a high speed.

SUMMARY OF THE INVENTION

It is, therefore, a primary object of the present invention to provide a semiconductor memory device, in which a plurality of data is continuously inputted/outputted at a high speed regardless of locations of accessed data.

In accordance with one aspect of the present invention, there is provided a semiconductor memory device comprising: a first bank including a first word line corresponding to a first row address; and a second bank including a second word line corresponding to a second row address, wherein the second row address is consecutive to the first row address.

In a burst mode in which N data stored corresponding to consecutive addresses are sequentially accessed, the second word line is activated at a timing when the first word line is activated, so that the predetermined number of data among the N data is sequentially accessed in a plurality of unit cells corresponding to the first word line and the remaining data is sequentially accessed in a plurality of unit cells corresponding to the second word line.

In accordance with another aspect of the present invention, there is provided a semiconductor memory device comprising: a plurality of banks; and a controller for decoding a lower M-bit row address signal corresponding to the number of the banks to enable the plurality of banks, M being an integer of 1 or more.

In accordance with further another aspect of the present invention, there is provided a method for driving a semiconductor memory device including a plurality of banks, in which the semiconductor memory device sequentially accesses N data stored corresponding to consecutive addresses. The method comprises the steps of: receiving a first row address corresponding to a command; activating a word line of a first bank corresponding to the first row address; activating a word line of a second bank corresponding to a second row address, the second row address being continuous to the first row address; sequentially accessing the predetermined number of data among the N data in a plurality of unit cells corresponding to the word line of the first bank; and sequentially accessing the remaining data in a plurality of unit cells corresponding to a word line of the second bank.

In accordance with still further another aspect of the present invention, there is provided an addressing method of a memory device including a plurality of banks, which is characterized in that a lower M-bit row address signal corresponding to the number of banks among the inputted row addresses is decoded to select a bank, M being an integer of 1 or more.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Hereinafter, the preferred embodiments of the present invention will be described in detail with reference to the accompanying drawings.

Figure 1:
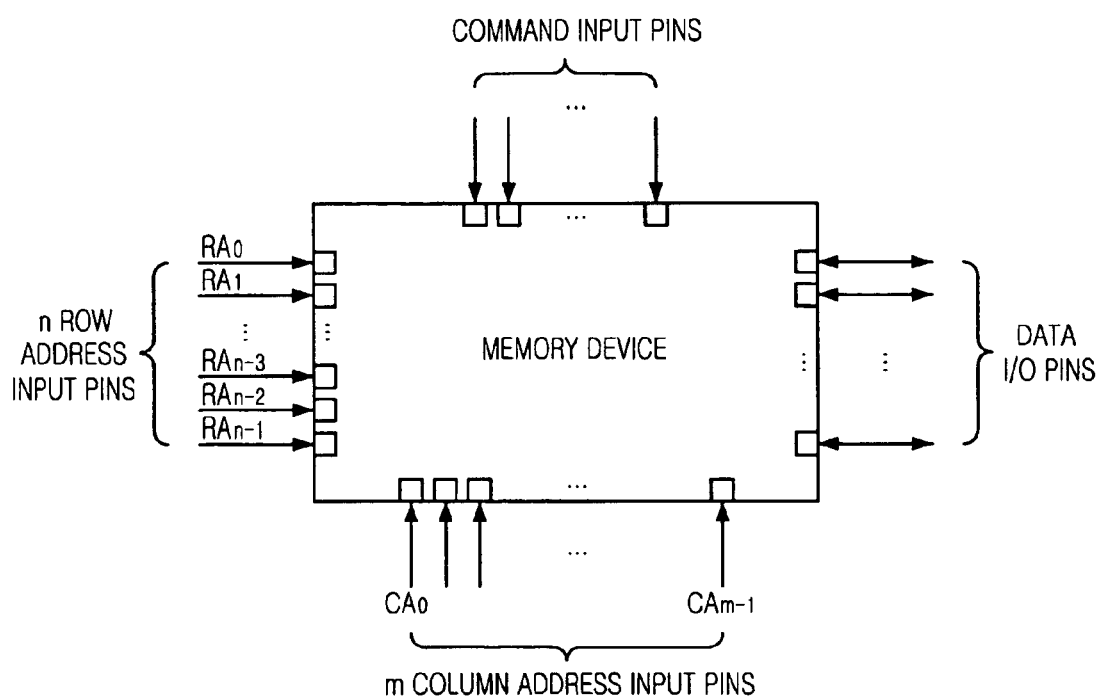
FIG. 1 is a block diagram showing I/O pins of a conventional memory device.
Figure 2:
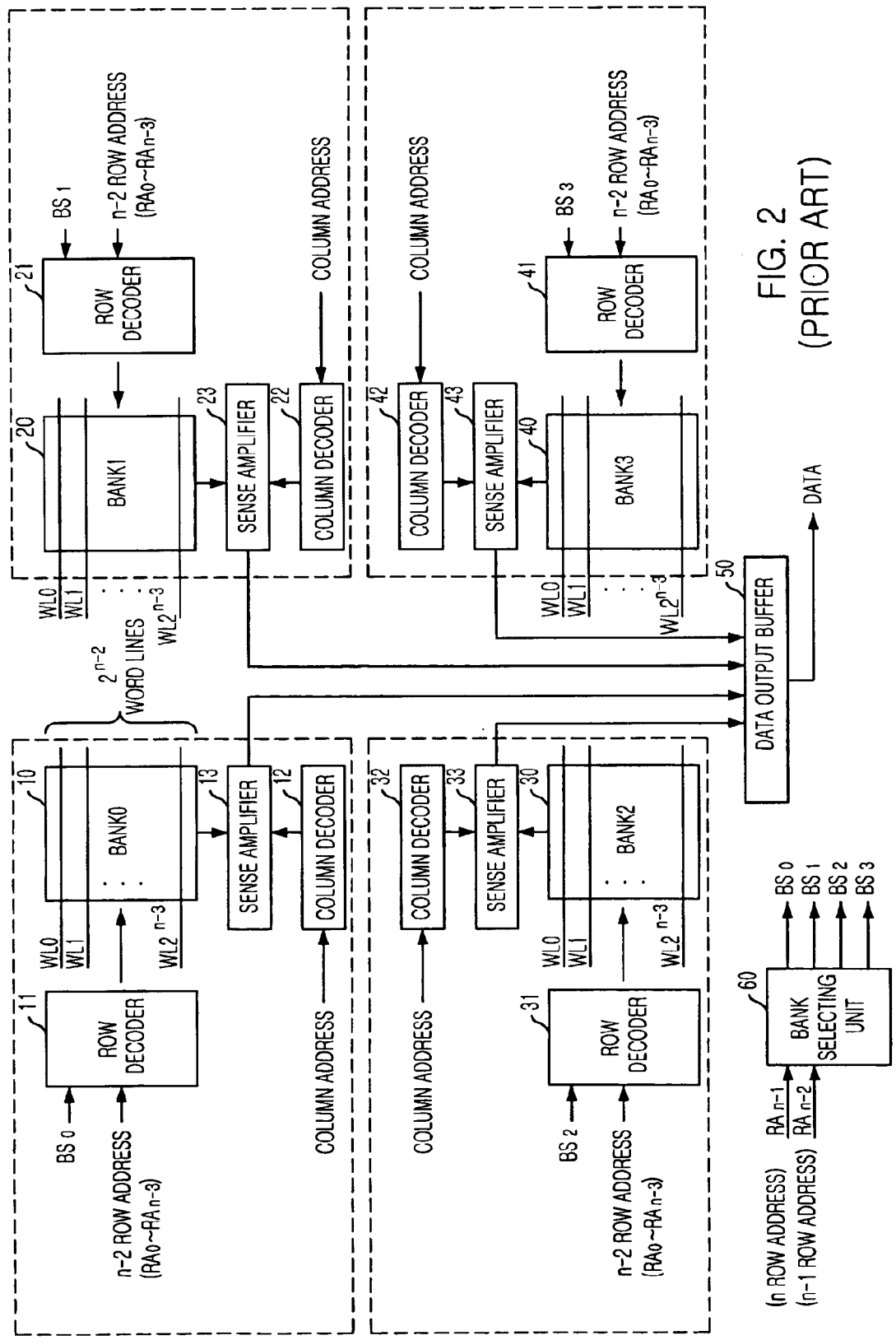
FIG. 2 is a block diagram of a conventional memory device.
Figure 3:
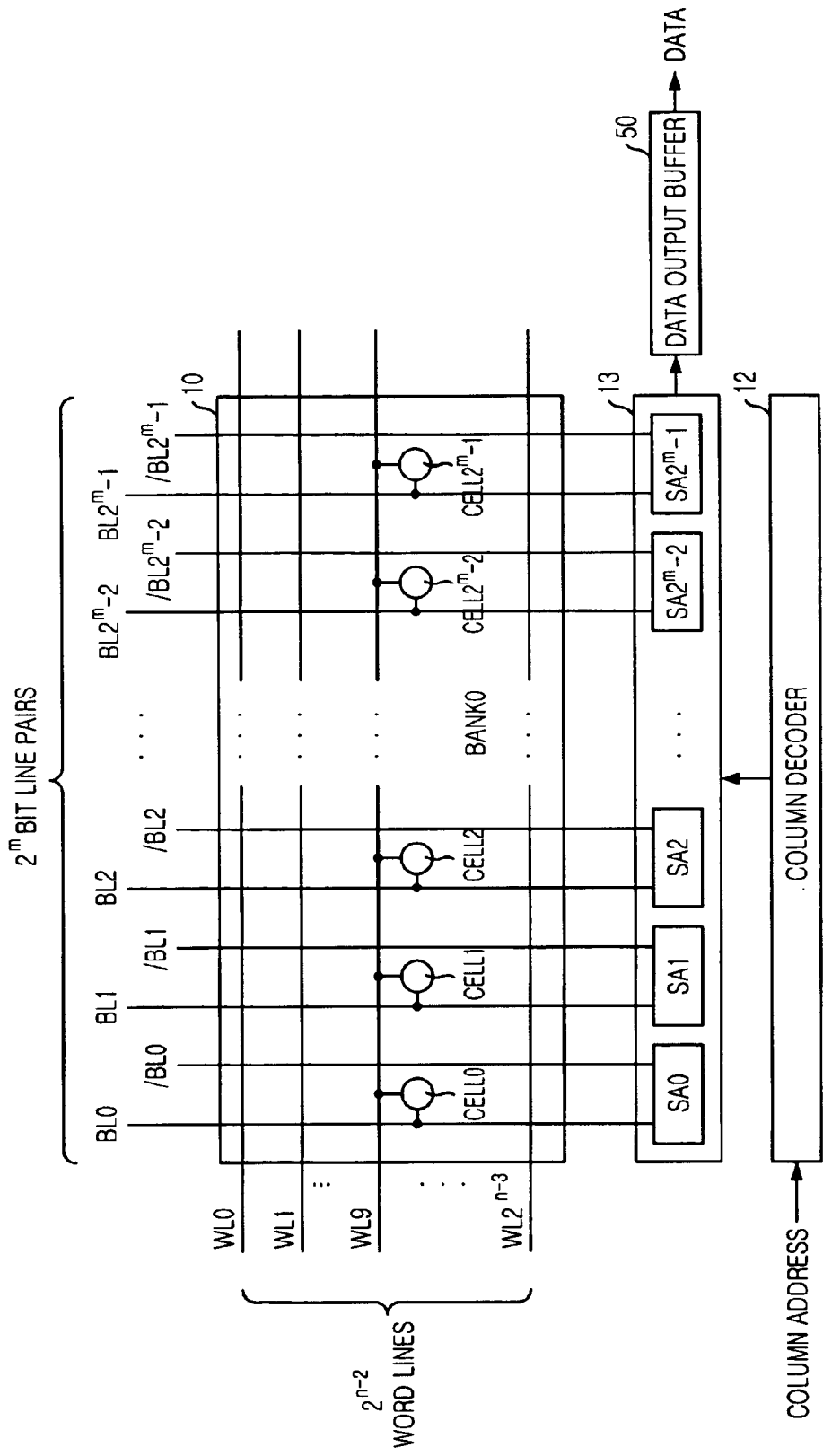
FIG. 3 is a block diagram showing problems of a conventional memory device.
Figure 4:
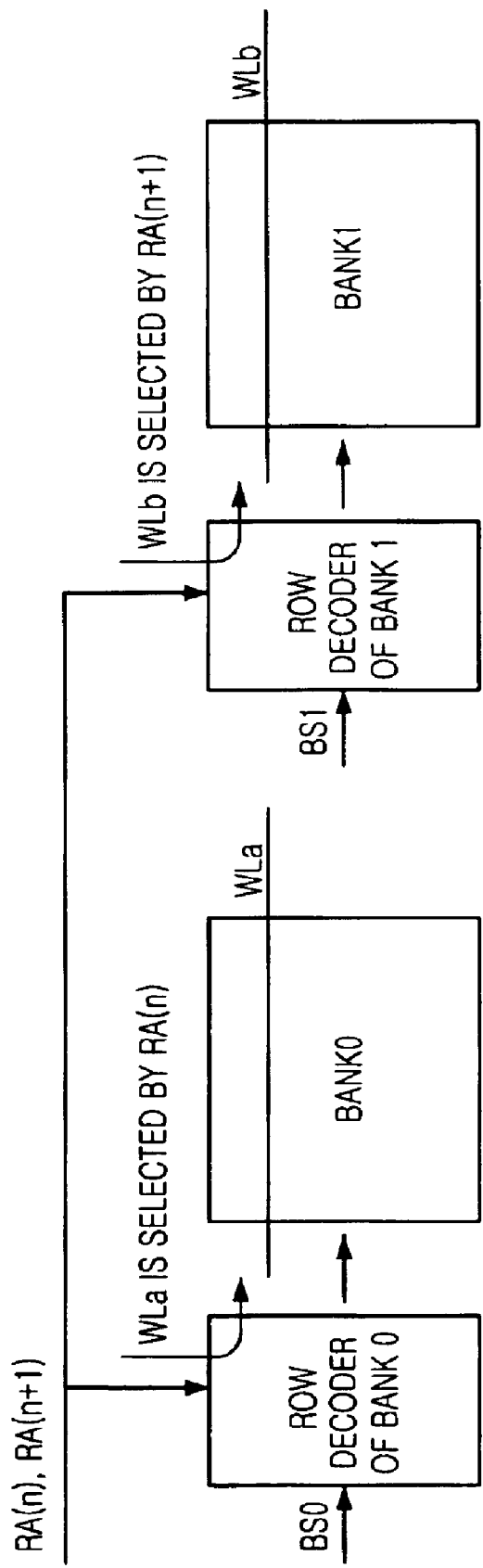
FIG. 4 is a block diagram of a memory device in accordance with a first embodiment of the present invention.

FIG. 4 is a block diagram of a memory device in accordance with a first preferred embodiment of the present invention.

Referring to FIG. 4, the memory device according to the present invention includes a bank 0 having a first word line WLa corresponding to a first row address RA(n), and a bank 1 having a second word line WLb corresponding to a second row address RA(n+1) that is consecutive to the first row address RA(n).

In accordance with an embodiment of the present invention, the memory device detects a location of a first data accessed corresponding to a first executing command in a burst mode in which N data stored corresponding to the consecutive addresses are accessed sequentially.

Then, considering the accessed first data and the number of data to be continuously outputted in the burst mode, it is determined whether to activate only one word line (e.g., WLa) corresponding to the executing command, or whether to also activate word lines of other banks corresponding to the consecutive row addresses. According to the determination result, row decoders of the banks 0 and 1 are activated at the same timing, or only the row decoder of the bank 0 is activated.

For example, it is assumed that 1024 unit cells correspond to one word line WLa. If the data accessed corresponding to the executing command is a 1023rd data of the word line WLa and the number of data to be outputted in the burst mode is "8", the word lines WLa and WLb of the banks 0 and 1 are activated at the same timing.

In this case, a sixth data is sensed/amplified from data of 1023rd and 1024th unit cells corresponding to the word line WLa and the first data of the word line WLb at the same timing and then sequentially outputted.

In addition, the locations of eight data to be continuously outputted in the burst mode and the location of the first data accessed corresponding to the executing command are detected. In the case of a stat that the eight data corresponding to the upper addresses than the first data can be sensed/amplified, only the word line WLa is sensed/amplified and eight sensed/amplified data are later accessed sequentially.

Figure 5:
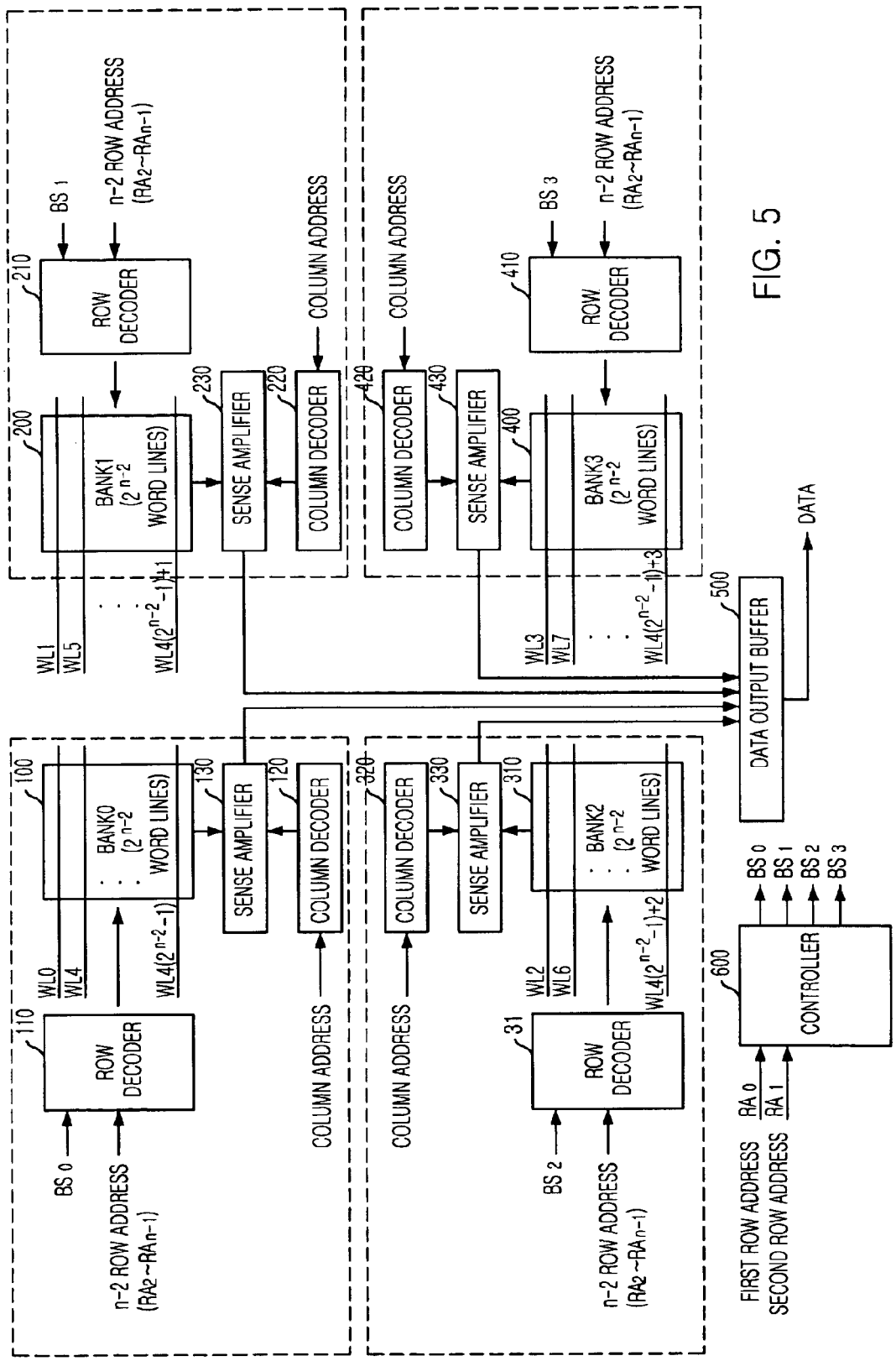
FIG. 5 is a block diagram of a memory device in accordance with a second embodiment of the present invention.

FIG. 5 is a block diagram of a memory device in accordance with a second preferred embodiment of the present invention. In FIG. 5, it is assumed that the memory device receives n row addresses and m column addresses.

Referring to FIG. 5, the memory device in accordance with a second preferred embodiment of the present invention includes four banks 100 to 400 and a controller 600 for decoding lower 2-bit row addresses RA0 and RA1 corresponding to the number (i.e., four) of the banks to generate bank select signals BS0 to BS3 for selecting the four banks 100 to 400.

In addition, each bank includes: row decoders 110–410 for decoding (n−2)-bit row addresses RA2 to RAn−1 except for the row addresses RA0 and RA1; bit sense amplifiers 130–430 each of which has $2^m$ sense amplifiers for sensing/amplifying data signals applied to $2^m$ bit line pairs provided on one word line; and column decoders 120–420 for decoding m-bit column addresses for select one of the $2^m$ sense amplifiers provided in the bit line sense amplifiers 130–430.

Further, $2^{n-2}$ word lines provided in one bank (e.g., bank0 100) correspond not to the consecutive row addresses but to the row addresses that are jumped by the number (i.e., four) of the banks.

In other words, according to the conventional memory device, as the row addresses are sequentially increasing, the word lines provided in the bank (e.g., the bank 0) are also increased like WL0, WL1, WL2, . . . . However, according to the present invention, the row addresses are sequentially increasing, the corresponding word lines are also. circulated according to the banks. Accordingly, in the case of the bank 0, the word lines provided in one bank is increased like WL0, WL4, WL8.

Figure 6:
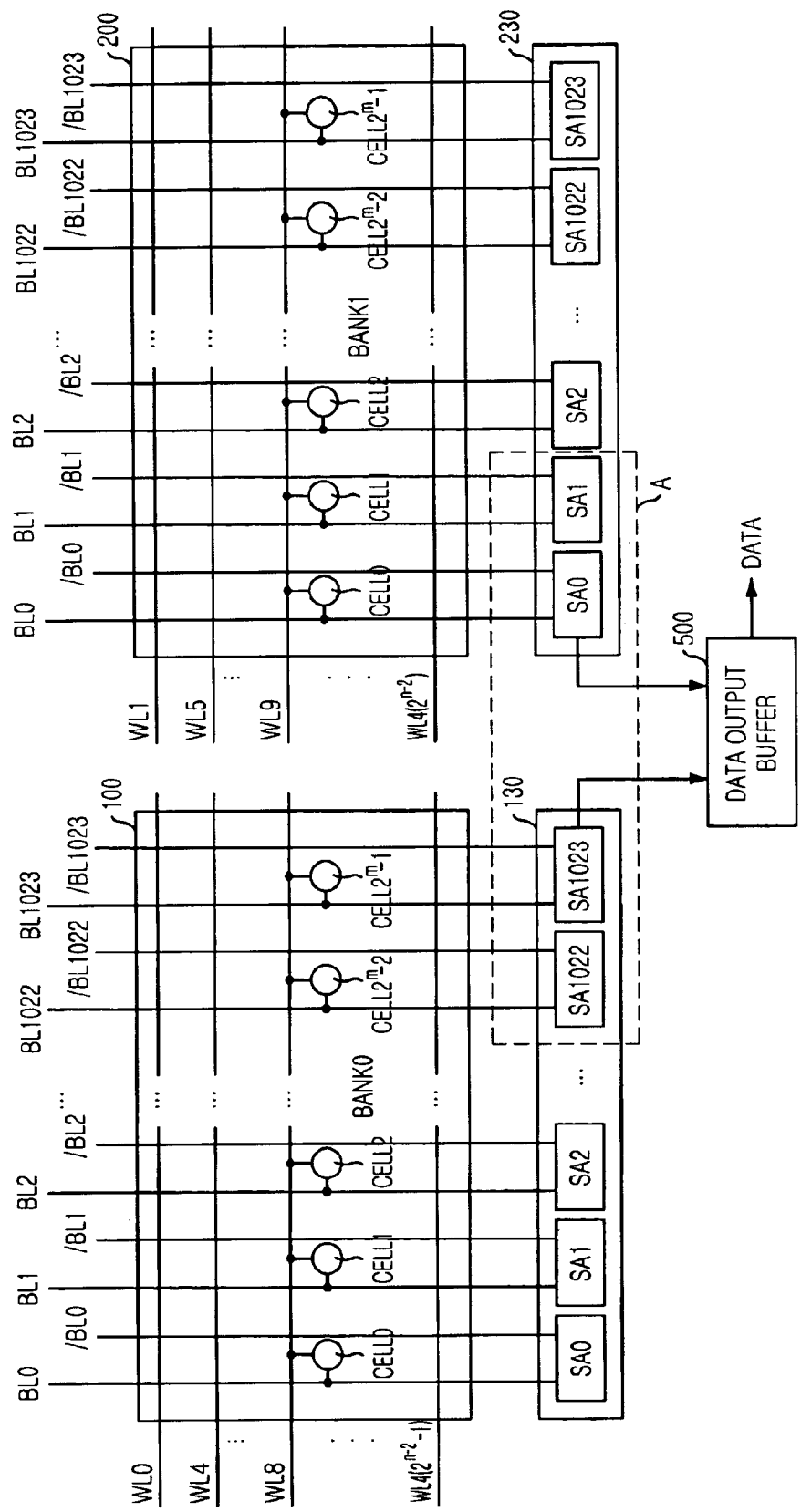
FIG. 6 is a block diagram illustrating data input/output of a memory device of FIG. 4 in a continuous burst mode.

FIG. 6 is a block diagram illustrating data input/output of a memory device of FIG. 4 in the continuous burst mode, in which 1024 unit cells correspond to one word line. Hereinafter, an operation of the memory device in accordance with the second embodiment of the present invention will be described with reference to FIGS. 5 and 6.

The controller 600 of the memory device receives the lowest 2-bit row addresses RA0 and RA1 among the inputted row addresses to output the bank select signals BS0 to BS3 for selecting the four banks (bank 0 to bank 3). The bank select signals BS0 to BS3 outputted from the controller 600 enables the row decoders provided to one side of each bank.

In addition, the controller 600 receives the column addresses and detects the location of data accessed in response to the executing command and the number of data to be continuously outputted in the burst mode. According to the detection result, it is determined whether to enable only one bank, or whether to enable two banks.

For example, as shown in FIG. 6, it is assumed that the unit cells corresponding to one word line is "1024" and the number of data to be outputted in the burst mode is "4". If the 1023rd data is first accessed by the input column-address, the controller 600 activates both the bank select signal BS0 and the bank select signal BS1.

In other words, the controller activates the two banks so that the second word line WL1 corresponding to the second row address consecutive to the first row address can be activated at a timing when the first word line WL0 corresponding to the first row address is activated.

Accordingly, all the row decoders 110 and 210 of the banks 100 and 200 are enabled at a timing when one command is executed and thus all the word lines WL0 and WL1 are activated.

If the both of the word lines WL0 and WL1 are activated, the 1024 data stored in the 1024 unit cells corresponding to the word line are sensed/amplified by the bit line sense amplifiers 130 and 230.

Then, among the sensed/amplified data, the data sensed/amplified by the 1023rd and 1024th sense amplifiers SA1022 and SA1023 of the bit line sense amplifier 130 and the four data sensed/amplified by the first and second sense amplifiers SA0 and SA1 of the bit line sense amplifier 230 are sequentially accessed through the data output buffer ("A" of FIG. 6).

In case the executing command is a read operation, the four data sensed/amplified by the sense amplifiers SA1022 and SA1203 of the bit line sense amplifier 130 and the sense amplifiers SA0 and SA1 of the bit line sense amplifier 230 are sequentially outputted to an exterior. In case the executing command is a write operation, the four external data are sequentially latched by the sense amplifiers SA1022 and SA1203 of the bit line sense amplifier 130 and the sense amplifiers SA0 and SA1 of the bit line sense amplifier 230 are sequentially outputted to an exterior.

Then, the 1024 data latched in the bit line sense amplifiers are re-stored into the respective unit cells corresponding to the word lines WL0 and WL1.

Meanwhile, in case the data that are more than the number of data to be outputted in the burst mode after the data to be first accessed among the 1024 data sensed/amplified corresponding to the command are already sensed/amplified in the bit line sense amplifiers, the two word lines need not be activated. In this case, the controller 600 generates the bank select signal to activate one bank. Accordingly, in this case, the memory device operates like the conventional memory device. At this time, one bit line sense amplifier is sequentially accessed as many as the number of data that are continuously outputted in the burst mode.

The conventional memory device can achieve the continuous burst mode only within data (data of one page) on the unit cells corresponding to one word line. The continuous burst mode cannot be achieved at the boundary portion exceeding one page. In this case, after the last data corresponding to one word line is outputted, the word line is activated and data of the corresponding unit cells are again sensed/amplified. Accordingly, according to the location of the first accessed data, the continuous burst mode cannot be used. Therefore, there is a limit on an interfacing of data between the external device (e.g., chipset) and the memory device.

As described above, according to the present invention, the banks of the memory device are selected using the least significant bit of the address and one or two banks are selectively operated according to the locations of the accessed data. Therefore, a plurality of data can be always outputted continuously regardless of the locations of the accessed data. In other words, the continuous burst mode can be achieved.

Accordingly, when data are interfaced between the external device (e.g., chipset) and the memory device, the limit on the locations of the accessed data are eliminated. As a result, the external device can continuously receive the plurality of data at a high speed, thereby improving an overall operating speed remarkably.

In addition, in the semiconductor memory device that includes a plurality of banks and sequentially accesses N data stored corresponding to consecutive addresses, a method for driving the semiconductor memory device includes the steps of: receiving a first row address corresponding to a command; activating a word line of a first bank corresponding to the first row address; activating a word line of a second bank corresponding to a second row address, the second row address being consecutive to the first row address; sequentially accessing the predetermined number of data among the N data in a plurality of unit cells corresponding to the word line of the first bank; and sequentially accessing the remaining data in a plurality of unit cells corresponding to a word line of the second bank.

Further, an addressing method of the memory device including a plurality of banks is characterized in that a lower M-bit row address signal corresponding to the number of banks among the inputted row addresses is decoded to select a bank, M being an integer of 1 or more.

If the memory device is driven or addressed using the driving and addressing methods of the present invention, the plurality of data can be continuously accessed at a high speed regardless of the locations of the accessed data.

In case a plurality of data are continuously outputted in the memory device having a plurality of banks, the plurality of data can be always outputted continuously at a high speed regardless of locations of the accessed data. Therefore, the system employing the memory device according to the present invention can always receive a plurality of data from the memory device at a high speed, thereby improving the performance of the system.

Further, the bank structure of the conventional memory device is used as it is and the banks are selected using the lower bits of the row addresses, so that the performance of the system is improved without any additional cost.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:

a first bank including a first word line corresponding to a first row address; and a second bank including a second word line corresponding to second row address, the second row address is consecutive to the first row address, wherein in a burst mode in which N data stored corresponding to consecutive addresses are sequentially accessed, the second word line is activated at a timing when the first word line is activated, so that the predetermined number of data among the N data is sequentially accessed in a plurality of unit cells corresponding to the first word line and the remaining data is sequentially accessed in a plurality of unit cells corresponding to the second word line.

2. A semiconductor memory device comprising:

a plurality of banks each having a plurality of word lines; and a controller for receiving a row address and a column address to activate predetermined word lines of different banks based on the column address, the row address and a burst length, wherein consecutive two word lines for storing and outputting data are respectively disposed in different banks if the data is not stored in cells corresponding to one word line.

3. The semiconductor memory device as recited in claim 2, wherein the controller activates two word lines when a value of adding the column address to the burst length is greater than a word line size.

4. The semiconductor memory device as recited in claim 2, wherein the controller activates one word line when a value of adding the column address to th burst length is not greater than a word line size.

5. The semiconductor memory device as recited in claim 4, wherein, in a burst mode in which N data stored corresponding to consecutive addresses are sequentially accessed, the controller sequentially accesses the predetermined number of data among the N data in a plurality of unit cells corresponding to a first word line, and sequentially accesses the remaining data in a plurality of unit cells corresponding to a second word line.

6. A method for driving a semiconductor memory device including a plurality of banks each having a plurality of word lines, the method comprising:

receiving a row address and a column address for accessing data included in the plurality of banks;

determining word lines to be activated based on the column address, the row address and a burst length; and activating predetermined word lines;

wherein consecutive two word lines for storing and outputting data are respectively disposed in different banks if the data is not stored in cells corresponding to one word line.

7. The method as recited in claim 6, further comprising:

decoding a predetermined number of lower bits of the row address to select a bank among the plurality of banks.

* * * * *